United States Patent
Ungnapatanin et al.

(10) Patent No.: US 9,847,360 B2
(45) Date of Patent: Dec. 19, 2017

(54) TWO-SIDE ILLUMINATED IMAGE SENSOR (71) Applicant: SAMSUNG ELECTRONICS CO., LTD., Suwon-si (KR)

(72) Inventors: Jesada Ungnapatanin, Seongnam-si (KR); Seokho Yun, Hwaseong-si (KR); Doyoon Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/274,741

(22) Filed: Sep. 23, 2016

(65) Prior Publication Data
US 2017/0092672 A1 Mar. 30, 2017

(30) Foreign Application Priority Data

Sep. 24, 2015 (KR) .................. 10-2015-0135546

(51) Int. Cl.
*H01L 27/146* (2006.01)

(52) U.S. Cl.
CPC .. *H01L 27/14605* (2013.01); *H01L 27/14621* (2013.01); *H01L 27/14627* (2013.01); *H01L 27/14645* (2013.01)

(58) Field of Classification Search
CPC ........... H01L 27/14621; H01L 27/1464; H01L 27/14605; H01L 27/14627; H01L 27/14645
See application file for complete search history.

(56) References Cited

U.S. PATENT DOCUMENTS

| 8,810,698 B2 | 8/2014 | Hiramoto et al. |
| 8,947,572 B2 | 2/2015 | Venezia et al. |
| 9,153,611 B2 | 10/2015 | Higashitsutsumi et al. |
| 2011/0181763 A1 | 7/2011 | Hiramoto et al. |
| 2013/0063641 A1 | 3/2013 | Venezia et al. |
| 2014/0138521 A1* | 5/2014 | Liu .................. H01L 27/14618 250/208.1 |
| 2014/0327061 A1* | 11/2014 | Lee .................. H01L 27/14634 257/292 |

FOREIGN PATENT DOCUMENTS

| JP | 4000449 B2 | 10/2007 |
| JP | 5584679 B2 | 9/2014 |
| KR | 10-2013-0108246 A | 10/2013 |
| WO | 2010/100896 A1 | 9/2010 |

* cited by examiner

*Primary Examiner* — Matthew Landau
*Assistant Examiner* — Scott Stowe
(74) *Attorney, Agent, or Firm* — Sughrue Mion, PLLC (57) ABSTRACT

A two-side illuminated image sensor includes: a first optical sensor layer and a second optical sensor layer each including a plurality of optical sensing cells, and a signal wiring layer disposed between the first and second optical sensor layers. The first and second optical sensor layers may include a first color filter layer and a second color filter layer each including a plurality of color filters corresponding to the plurality of optical sensing cells.

13 Claims, 9 Drawing Sheets

TWO-SIDE ILLUMINATED IMAGE SENSOR

CROSS-REFERENCE TO RELATED APPLICATION

This application claims priority from Korean Patent Application No. 10-2015-0135546, filed on Sep. 24, 2015 in the Korean Intellectual Property Office, the disclosure of which is incorporated herein by reference in its entirety.

BACKGROUND

1. Field

Apparatuses consistent with exemplary embodiments relate to a two-side illuminated image sensor for capturing an image by using both a front side and a rear side of the two-side illuminated image sensor.

2. Description of the Related Art

A color image sensor generally uses a color sensor to sense a color of incident light. For example, a color display apparatus or a color image sensor which is currently being used may include arrays of a red color filter that transmits only red light, a green color filter that transmits only green light, and a blue color filter that transmits only blue light. Accordingly, a red pixel at which the red color filter is disposed may display or sense only red light, a green pixel at which the green color filter is disposed may display or sense only green light, and a blue pixel at which the blue color filter is disposed may display or sense only blue light. In such a structure, a particular color may be expressed by adjusting an amount of light respectively at the red pixel, the green pixel, and the blue pixel, or determine a color of incident light by sensing an amount of light respectively at the red pixel, the green pixel, and the blue pixel. At present, various technologies for capturing an image by using a front side and a rear side of the color image sensor are being proposed.

SUMMARY

One or more exemplary embodiments provide two-side illuminated image sensors for capturing an image by using both a front side and a rear side of the two-side illuminated image sensors, thus enhancing light efficiency.

According to an aspect of an exemplary embodiment, there is provided a two-side illuminated image sensor including: a first optical sensor layer comprising a plurality of optical sensing cells configured to sense a light incident from a first side of the image sensor and generate an electrical signal based on the light incident from the first side; a second optical sensor layer comprising a plurality of optical sensing cells configured to sense a light incident from a second side of the image sensor and generate an electrical signal based on the light incident from the second side, the second side opposing the first side; a signal wiring layer disposed between the first optical sensor layer and the second optical sensor layer, and configured to read the electrical signal obtained from the first optical sensor layer and the electrical signal obtained from the second optical sensor layer; a first color filter layer disposed on the first optical sensor layer, and including a plurality of color filters respectively facing the plurality of optical sensing cells in the first optical sensor layer; and a second color filter layer disposed on the second optical sensor layer, and including a plurality of color filters respectively facing the plurality of optical sensing cells in the second optical sensor layer.

The two-side illuminated image sensor may further include a first microlens array disposed on the first color filter layer and including a plurality of microlenses.

A size of a light-receiving surface of the plurality of optical sensing cells in the first optical sensor layer may be equal to a size of a light-receiving surface of the plurality of optical sensing cells in the second optical sensor layer.

The plurality of optical sensing cells in the first optical sensor layer and the plurality of optical sensing cells in the second optical sensor layer may be arranged to face each other in a one-to-one correspondence with each other.

A size of a light-receiving surface of each of the plurality of optical sensing cells in the first optical sensor layer may be different from a size of a light-receiving surface of each of the plurality of optical sensing cells in the second optical sensor layer.

An optical sensing cell in the second optical sensor layer may be arranged to face a plurality of optical sensing cells in the first optical sensor layer.

Four optical sensing cells of the plurality of optical sensing cells in the first optical sensor layer may be arranged in a two-by-two form, and arranged to face the optical sensing cell in the second optical sensor layer.

The two-side illuminated image sensor may further include a second microlens array disposed on the second color filter layer and including a plurality of microlenses.

The plurality of microlenses in the second microlens array and the plurality of color filters in the second color filter layer may be arranged to face each other in a one-to-one correspondence with each other.

The plurality of microlenses in the second microlens array and the plurality of color filters in the second color filter layer may be arranged to be misaligned with the plurality of optical sensing cells in the second optical sensor layer.

A space between the plurality of microlenses in the second microlens array may be smaller than a space between the plurality of optical sensing cells in the second optical sensor layer.

The first side may be a front side of the two-side illuminated image sensor, and the second side may be a rear side of the two-side illuminated image sensor.

According to an aspect of another exemplary embodiment, there is provided a two-side illuminated image sensor including: an optical sensor layer including a plurality of optical sensing cells configured to sense a light and generate an electrical signal based on the incident light; a signal wiring layer configured to read the electrical signal obtained from the optical sensor layer; a first color filter layer disposed on the optical sensor layer, and including a plurality of first color filters respectively facing the plurality of optical sensing cells; a second color filter layer including a plurality of second color filters respectively facing the plurality of optical sensing cells across the signal wiring layer that is disposed between the first color filter layer and the second color filter layer; and a second microlens array disposed on the second color filter layer, and including a plurality of microlenses arranged to face the plurality of second color filters, wherein a plurality of microlenses in the second microlens array and the plurality of optical sensing cells in the optical sensor layer are arranged to be misaligned with each other in a horizontal direction.

A space between the plurality of microlenses in the second microlens array may be smaller than a space between the plurality of optical sensing cells in the optical sensor layer.

A color filter in the second color filter layer may be arranged to face the plurality of optical sensing cells in the optical sensor layer.

Four optical sensing cells of the plurality of optical sensing cells in the first optical sensor layer may be arranged in a two-by-two form, and a color filter in the second color filter layer may be arranged to face the four optical sensing cells.

The two-side illuminated image sensor may further include a first microlens array disposed on the first color filter layer and including a plurality of microlenses.

BRIEF DESCRIPTION OF THE DRAWINGS

The above and/or other aspects will more apparent by describing certain exemplary embodiments, with reference to the accompanying drawings, in which.

DETAILED DESCRIPTION

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

Hereinafter, when an element or layer is referred to as being "on" another element or layer, the element or layer can directly on the other layer, or intervening layers may also be present.

Figure 1A:
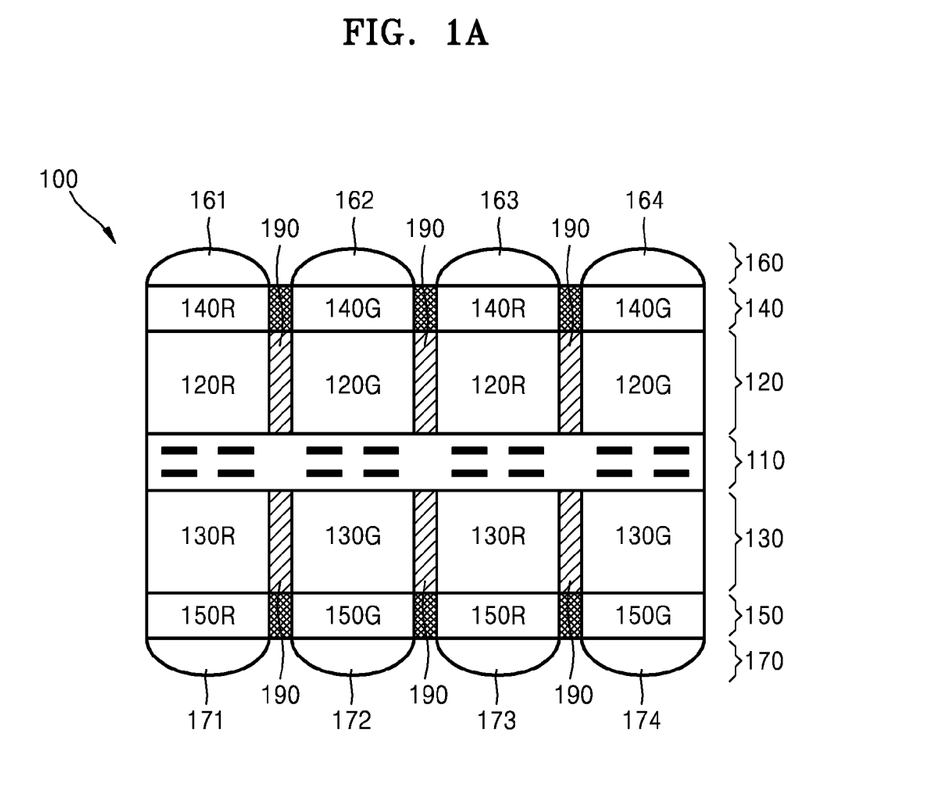
FIGS. 1A and 1B illustrate diagrams of a two-side illuminated image sensor according to an exemplary embodiment.
Figure 1B:
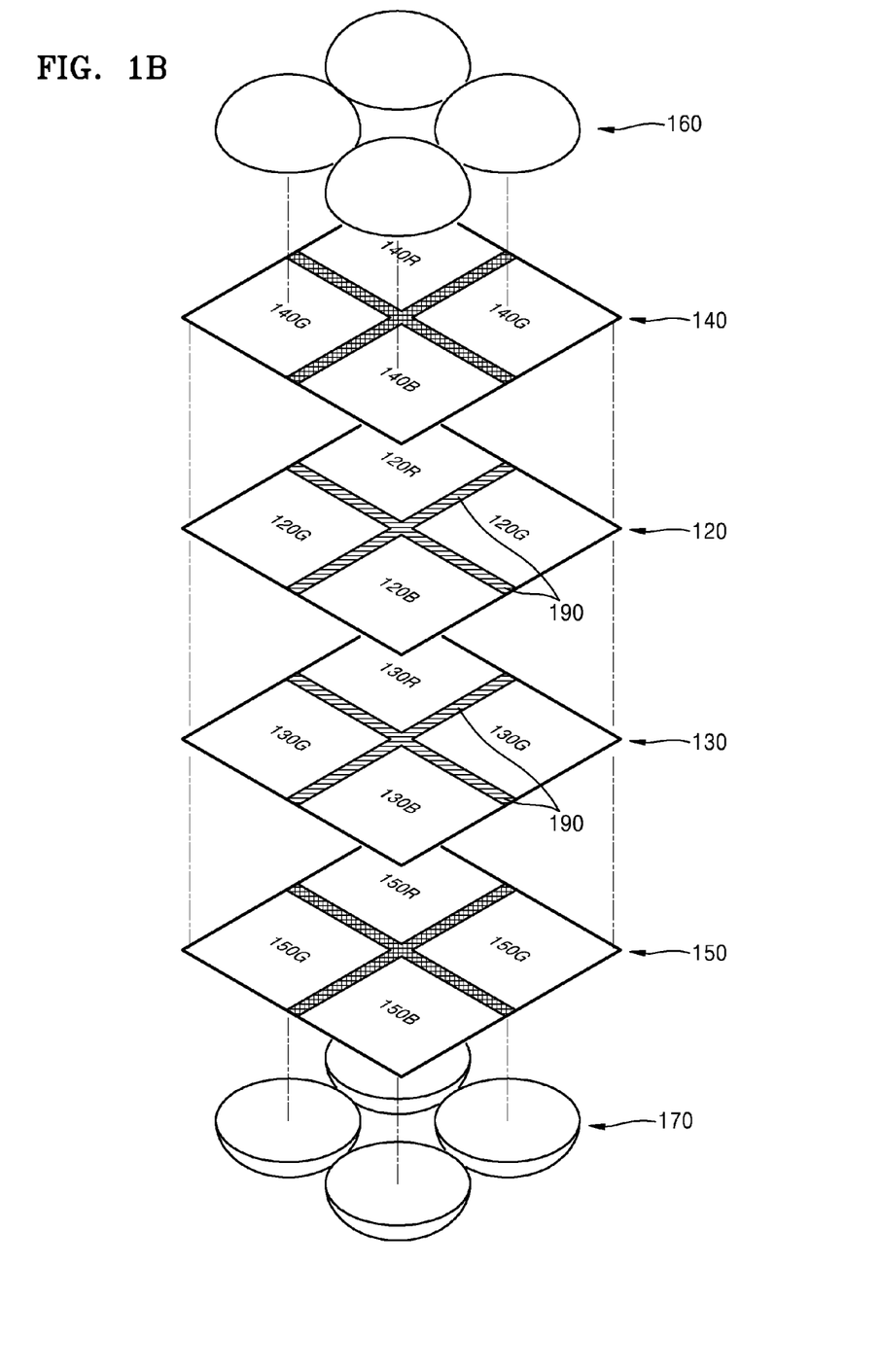

FIGS. 1A and 1B illustrate a diagram of a two-side illuminated image sensor 100 according to an exemplary embodiment. FIG. 1A is a cross-sectional view of the two-side illuminated image sensor 100 according to an exemplary embodiment. Referring to FIGS. 1A and 1B, the two-side illuminated image sensor 100 may include a first optical sensor layer 120, a second optical sensor layer 130 arranged to be shifted from the first optical sensor layer 120, a signal wiring layer 110 located between the first optical sensor layer 120 and the second optical sensor layer 130, a first color filter layer 140 located on the first optical sensor layer 120, and a second color filter layer 150 located on the second sensor layer 130.

The first and second optical sensor layer 120 and 130 may include a plurality of optical sensing cells that sense light, and thus, generate an electrical signal. The first optical sensor layer 120 may include optical sensing cells 120R, 120G, and 120B, and the second optical sensor layer 130 may include optical sensing cells 130R, 130G, and 130B. For example, the plurality of optical sensing cells 120R, 120G, 120B, 130R, 130G, and 130B may include red optical sensing cells 120R and 130R, green optical sensing cells 120G and 130 G, and blue optical sensing cells 120B and 130B. FIG. 1A shows, for convenience, four optical cells with respect to each optical sensing layer. However, a great number of optical sensing cells may be actually arranged in the form of a two-dimensional (2D) array. The plurality of optical sensing cells may sense light and generate an electrical signal independently from each other. For example, an electrical signal generated by the optical sensing cell 120G may depend on only a strength of light incident on the optical sensing cell 120G, regardless of a strength of light incident on the optical sensing cell 120R that is adjacent to the optical sensing cell 120G. The first optical sensor layer 120 and the second optical sensor layer 130 may include a charge-coupled device (CCD) sensor or a complementary metal-oxide semiconductor (CMOS) sensor.

Color filters 140R, 140G, and 140B in the first color filter layer 140 may respectively arranged on the optical sensing cells 120R, 120G, and 120B in the first optical sensor layer 120 which respectively correspond to the color filters 140R, 140G, and 140B. For example, a plurality of the color filters 140R, 140G, and 140B included in the first color filter layer 140 may include one from among a red color filter 140R that transmits light in a red-wavelength band, a green color filter 140G that transmits light in a green-wavelength band, and a blue color filter 140B that transmits light in a blue-wavelength band, from among incident light. FIG. 1A shows only two red color filters 140R and two green color filters 140G with respect to the first color filter layer 140 for convenience. However, a great number of red color filters 140R, green color filters 140G, and blue color filters 140B may be actually arranged on the first optical sensor layer 120 in the form of a 2D array.

Color filters 150R, 150G, and 150B in the second color filter layer 150 may be respectively arranged on the optical sensing cells 130R, 130G, and 130B in the second optical sensor layer 130 which respectively correspond to the color filters 150R, 150G, and 150B. For example, a plurality of the color filters 150R, 150G, and 150B included in the second color filter layer 150 may include one from among a red color filter 150R that transmits light in a red-wavelength band, a green color filter 150G that transmits light in a green-wavelength band, and a blue color filter 150B that transmits light in a blue-wavelength band, from among incident light. FIG. 1A illustrates only two red color filters 150R and two green color filters 150G included in the second color filter layer 150 for convenience. However, a great number of red color filters 150R, green color filters 150G, and blue color filters 150B may be actually arranged on the second optical sensor layer 130 in the form of a 2D array.

Referring to FIGS. 1A and 1B, the first color filter layer 140 is two dimensionally arranged with the red color filter 140R, the green color filter 140G, and the blue color filter 140B. Also, the second filter layer 150 is two dimensionally arranged with the red color filter 150R, the green color filter 150G, and the blue color filter 150B. However, this is only an example, and the arrangement of the filters is not limited thereto. The first color filter layer 140 and the second color filter layer 150 may include color filters having other colors. For example, the first color filter layer 140 and the second color filter layer 150 may include cyan color filters, yellow color filters, green color filters, and magenta color filters. Alternately, filters having cutoff characteristics with respect to other wavelength bands, which include an infrared light band or an ultraviolet light band, may be further employed, as needed. Hereinafter, it is to be noted that, in the first color filter layer 140 and the second color filter layer 150, colors of respective color filters and an order in which the color filters are arranged are only examples provided for convenience of description.

Separating layers 190 may be respectively arranged between the plurality of color filters 140R, 140G, and 140B in the first color filter layer 140, and may optically separate color filters 140R, 140G, and 140B respectively from other color filters 140R, 140G, and 140B adjacent thereto. Additionally, the separating layers 190 may be respectively arranged between a plurality of the color filters 150R, 150G, and 150B in the second color filter layer 150, and may optically separate color filters 150R, 150G, and 150B respectively from other color filters 150R, 150G, and 150B adjacent thereto. The separating layers 190 may be formed of a material having a lower refractive index that those of a plurality of color filters. For example, the separating layers 190 may be formed of a material such as polymethylmetacrylate (PMMA), silicon acrylate, cellulose acetate butyrate (CAB), silicon dioxide ($SiO_2$), fluoro-silicon acrylate (FSA), or the like. The separating layer 190 may be formed of any material having a refractive index that meets a certain condition. Particularly, the separating layer 190 may be formed of a material which is used in a general semiconductor process, such as a method of physical vapor deposition (PVD) or chemical vapor deposition (CVD).

The signal wiring layer 110 is arranged between the first optical sensor layer 120 and the second optical sensor layer 130, and may transmit an electrical signal, generated according to an amount of light having arrived at the first optical sensor layer 120 and the second optical sensor layer 130, to a processor. The signal wiring layer 110 may include a plurality of metal wirings. Due to such an arrangement of the signal wiring layer 110, back light may be incident on the first optical sensor layer 120 right after passing through the first color filter layer 140, and front light may be incident on the second optical sensor layer 130 right after passing through the second color filter layer 150. Accordingly, regardless of whether incident light is incident from a front side or a rear side of the two-side illuminated image sensor 100, the incident light may directly arrive at an optical sensor layer without having to pass through the signal wiring layer 110 formed of metal. For example, incident light from the front side may pass the second filter layer 150 and reach the second optical sensor layer 130 without passing through the signal wiring layer 110. For example, incident light from the rear side may pass the first filter layer 140 and reach the first optical sensor layer 120 without passing through the signal wiring layer 110. Thus, the two-side illuminated image sensor 100 may prevent scattering or reflection of the incident light which may be caused by a signal wiring formed of metal.

A plurality of optical sensing cells in the first optical sensor layer 120 and a plurality of optical sensing cells in the second optical sensor layer 130 may be arranged to face each other in one-to-one correspondence with each other. In the current exemplary embodiment, the two-side illuminated image sensor 100 includes one signal wiring layer 110, and the signal wiring layer 110 may read both an electrical signal from the first optical sensor layer 120 and an electrical signal from the second optical sensor layer 130. Thus, a circuit for reading such electrical signals may be easily configured when a plurality of sensing cells are arranged to face each other in one-to-one correspondence with each other.

A size of a light-receiving surface of a plurality of optical sensing cells in the first optical sensor layer 120 may be the same as a size of a light-receiving surface of a plurality of optical sensing cells in the second optical sensor layer 130. Thus, a number of pixels of a front side of the two-side illuminated image sensor 100 may be the same as a number of pixels of a rear side thereof.

A first microlens array 160 may be arranged on the first color filter layer 140. The first microlens array 160 may include a plurality of microlenses 161 through 164. The plurality of microlenses 161 through 164 may be arranged to respectively face the color filters 140R, 140G, and 140B in the first color filter layer 140. The first microlens array 160 may collect and transmit light, received from the rear side, to the optical sensing cells 120R, 120G, and 120B in the first optical sensor layer 120, thus improving efficiency of light.

A second microlens array 170 may be arranged on the second color filter layer 150. The second microlens array 170 may include a plurality of microlenses 171 through 174. The plurality of microlenses 171 through 174 may be arranged to face the color filters 150R, 150G, and 150B on the second color filter layer 150. The second microlens array 170 may collect and transmit light, received from the front side, to the optical sensing cells 130R, 130G, and 130B in the second optical sensor layer 130, thus improving efficiency of light.

Figure 2A:
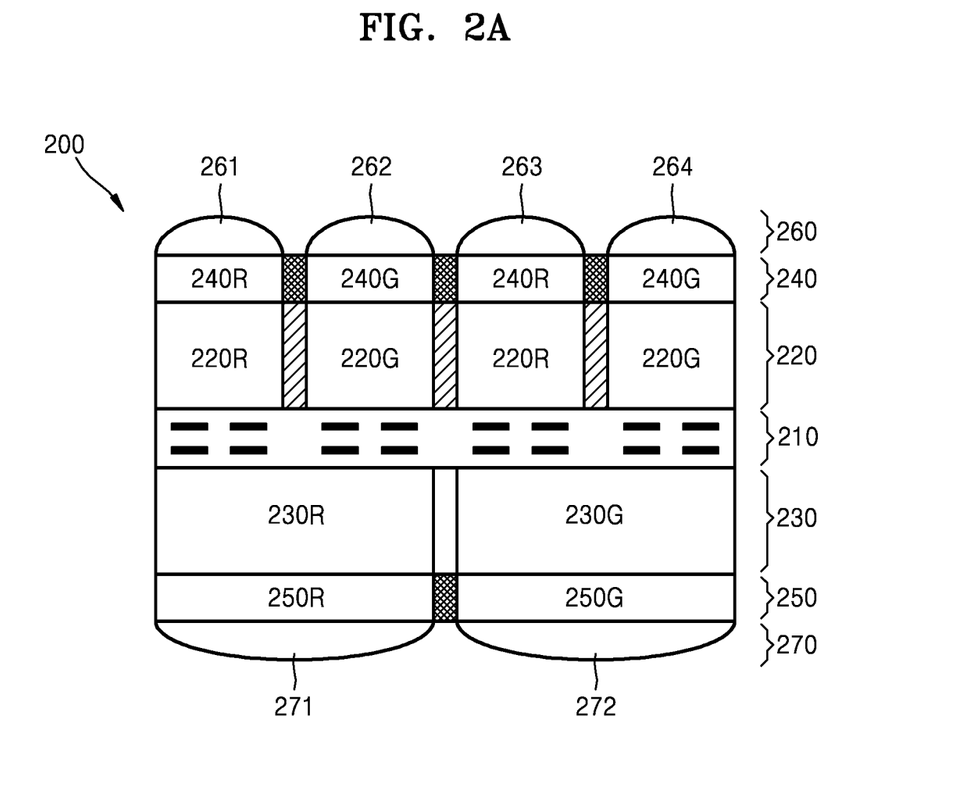
FIGS. 2A and 2B illustrate diagrams of a two-side illuminated image sensor according to another exemplary embodiment.
Figure 2B:
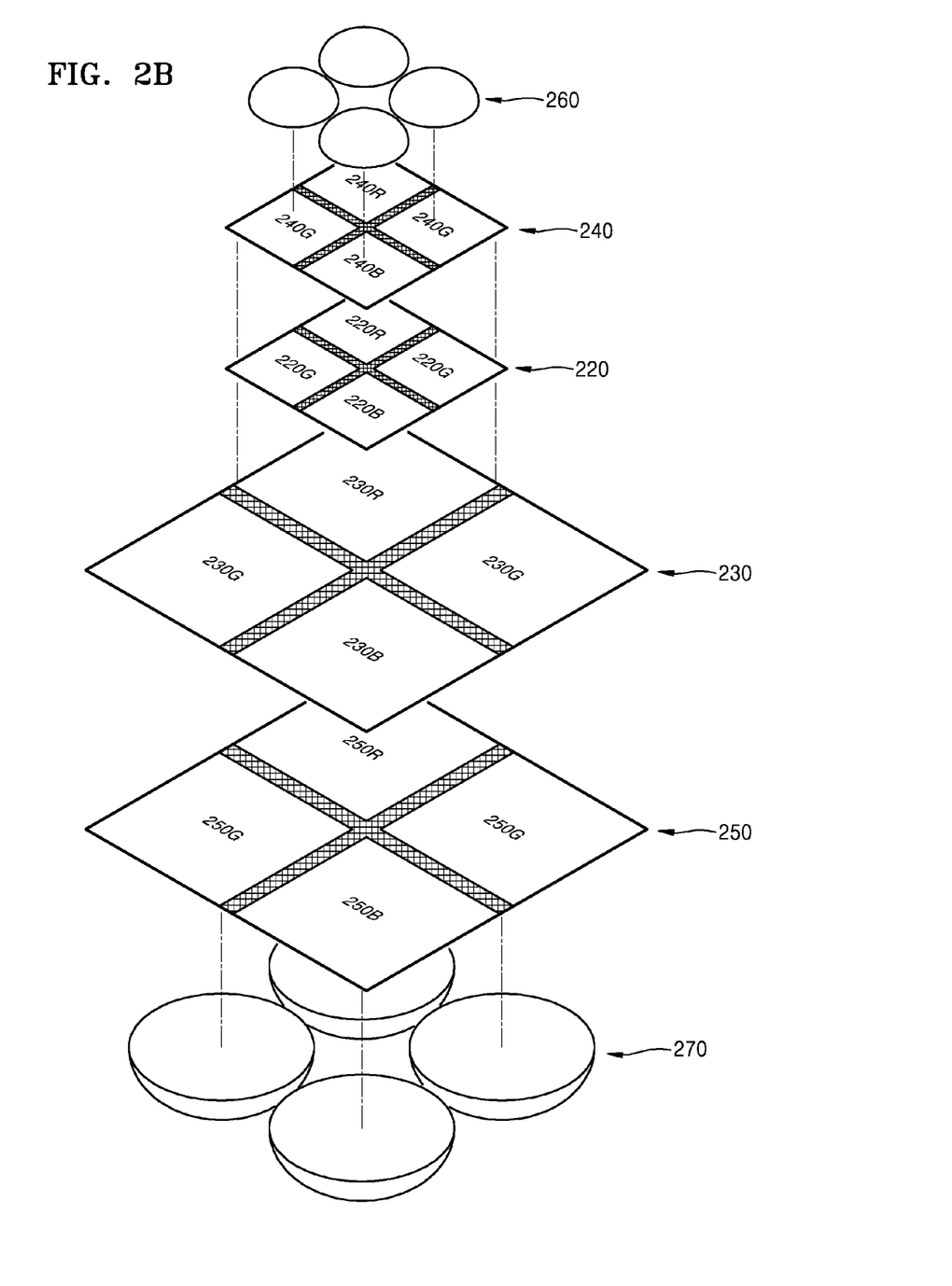

FIGS. 2A and 2B illustrate diagrams of a two-side illuminated image sensor 200 according to another exemplary embodiment. FIG. 2A is a cross-sectional view of the two-side illuminated image sensor 200 according to another exemplary embodiment. The two-side illuminated image sensor 200 may include a first optical sensor layer 220, a second optical sensor layer 230, a signal wiring layer 210 located between the first optical sensor layer 220 and the second optical sensor layer 230, a first color filter layer 240 disposed on the first optical sensor layer 220, and a second color filter layer 250 disposed on the second sensor layer 230. The first optical sensor layer 220 may include optical sensing cells 220R, 220G, and 220B, and the second optical sensor layer 230 may include optical sensing cells 230R, 230G, and 230B. In the current embodiment, a size of a light-receiving surface of a plurality of optical sensing cells in the first optical sensor layer 220 may be different from a size of a light-receiving surface of a plurality of optical sensing cells in the second optical sensor layer 230. If a size of a light-receiving surface of optical sensing cells located at a front side of the two-side illuminated image sensor 200 is large, a size of each pixel on the front side of the image sensor is large and, thus, a total number of pixels on the front side of the image sensor is decreased. Accordingly, in the current embodiment, a number of pixels of a front side of the two-side illuminated image sensor 200 may be different from a number of pixels of a rear side thereof.

An optical sensing cell in the second optical sensor layer 230 may be arranged to face a plurality of optical sensing cells in the first optical sensor layer 220. In such an arrangement, an electrical signal may be easily read. Referring to FIG. 2B, an optical sensing cell in the second optical sensor layer 230 may be arranged to face four optical sensing cells arranged in a 2×2 form in the first optical sensor layer 220. In such an arrangement, a number of pixels of a rear side of the two-side illuminated image sensor 200 (corresponding to a total number of optical sensing cells in the second optical sensor layer 230) is four times a number of pixels of a front side thereof (corresponding to a total number of optical sensing cells in the first optical sensor layer 220). A number of pixels of the front side is ¼ times a number of pixels of the rear side. An amount of light received by each pixel of the front side is 4 times an amount of light received by each pixel of the rear side. Accordingly, in this case, a clear image may be obtained in a dark place when the image is captured by using the front side instead of using the rear side. For example, a two-side illuminated image sensor may be used for a smartphone. Capturing of an image by using a front side of the two-side illuminated image sensor may be used to capture an image of people, such as taking a selfie photograph, which does not require many pixels, and capturing of an image by using a rear side thereof may be used to capture an image of landscapes, or the like which requires many pixels. In the current exemplary embodiment, optical sensing cells 230R, 230G and 230B located at the front side have a larger light-receiving surface than that of optical sensing cells 220R, 220G and 220B located at the rear side, and thus, optical sensing cells located at the front side have higher sensitivity to light than those located at the rear side. For this, each of optical sensing cells at the front side may receive a sufficient amount of light even in a dark indoor place.

The two-side illuminated image sensor 200 may further include a first microlens array 260 arranged on the first color filter layer 240 and a second microlens array 270 arranged on the second color filter layer 250. The first microlens array 260 may include a plurality of microlenses, including microlenses 261 through 264. The plurality of microlenses of the first microlens array 260 are arranged to face the color filters 240R, 240G, and 240B. The second microlens array 270 may include a plurality of microlenses, including microlenses 271 and 272. The plurality of microlenses of the second microlens array 250 are arranged to face the color filters 250R, 250G, and 250B.

Figure 3A:
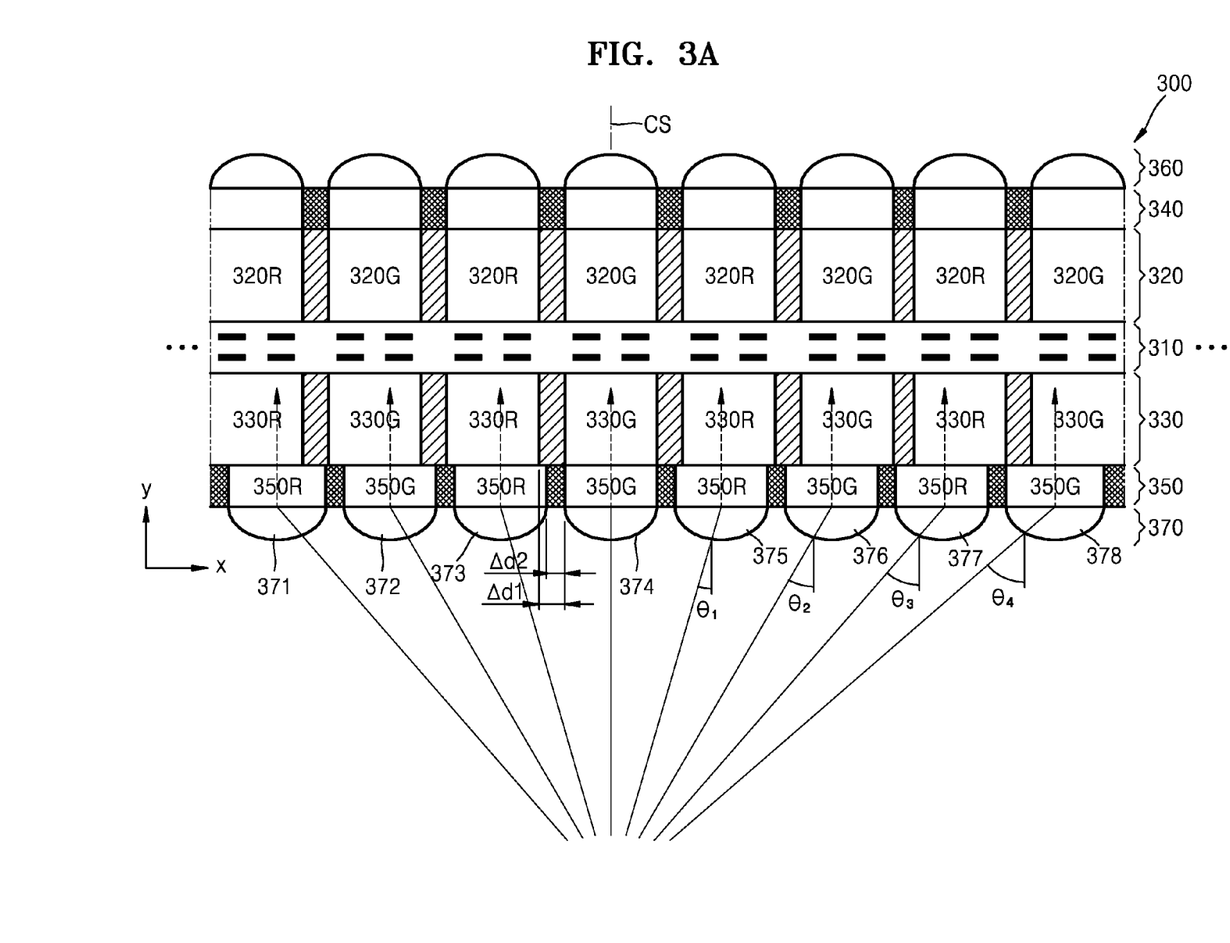
FIGS. 3A and 3B illustrate diagrams of a two-side illuminated image sensor according to another exemplary embodiment.
Figure 3B:
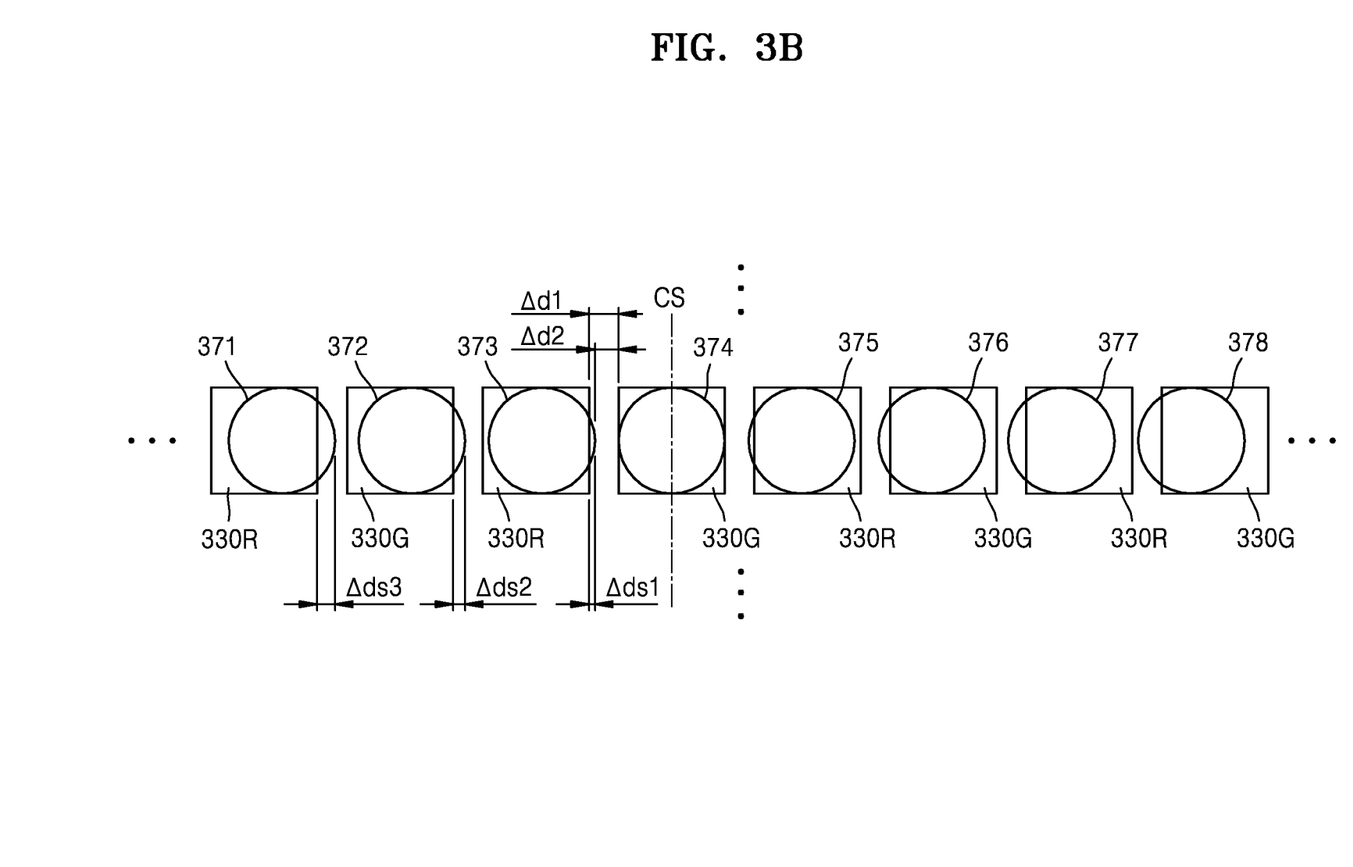

FIGS. 3A and 3B illustrate diagrams of a two-side illuminated image sensor 300 according to another exemplary embodiment. The rear side of the two-side illuminated image sensor 300 has the same features as those of the rear side of the two-side illuminated image sensor 100 shown in FIG. 1A. Thus, hereinafter, a difference therebetween is described.

Referring to FIG. 3A, the two-side illuminated image sensor 300 may include a first optical sensor layer 320 that includes a plurality of optical sensing cells, a second optical sensor 330 that is arranged to be shifted from the first optical sensor layer 320 and includes a plurality of optical sensing cells, a signal wiring layer 310 located between the first optical sensor layer 320 and the second optical sensor layer 330, a first color filter layer 340 located on the first optical sensor layer 320, a second color filter layer 350 located on the second sensor layer 330, a first microlens array 360 arranged on the first color filter layer 340, and a second microlens array 370 that is arranged on the second color filter 350 and includes a plurality of microlenses. A plurality of microlenses included in the second microlens array 370 and a plurality of optical sensing cells included in the second optical sensor layer 330 may be misaligned with each other in an x-axis direction (i.e., horizontal direction).

In the two-side illuminated image sensor 300, a space Δd1 between the plurality of optical sensing cells in the second optical sensor layer 330 may be smaller than a space Δd2 between the plurality of microlenses in the second microlens array 370, and a microlens and an optical sensing cell which are located at a center CS of the two-side illuminated image sensor 300 are aligned with each other. In such an arrangement, if an optical sensing cell and a microlens corresponding thereto are away from a center of the two-side illuminated image sensor 300, the optical sensor and the microlens may be greatly shifted from each other. Referring to FIG. 3A, a space Δd1 between an optical sensing cell 330R in the second optical sensor layer 330 and an optical sensing cell 330G adjacent thereto may be constant. Additionally, a space Δd2 between a plurality of microlenses in the microlens array 370 may be constant. The space Δd2 between the plurality of microlenses in the second microlens array 370 may be smaller than the space Δd1 between optical sensing cells. The optical sensing cell 330G and the microlens 371 located at the center CS of the two-side illuminated image sensor 300 may be arranged at a same location. A plurality of other microlenses and optical sensing cells corresponding thereto are arranged to be misaligned with each other. The greater the distance of a microlens and an optical sensing cell from the center CS of the two-side illuminated image sensor 300 is, the greater the misalignment between the microlens and the optical sensing cell is in the x-axis direction. Referring to FIG. 3A, the misalignment between the microlens 372 and the corresponding sensing cell 330G, which are located father from the center CS, may be greater than the misalignment between the microlens 373 and the corresponding sensing cell 330R, which are located closer to the center CS.

In the current exemplary embodiment, the light may be incident in non-parallel from the front side, and thus the two-side illuminated image sensor 300 have different incident angles from each other with respect to each pixels at the front side. Light incident on the two-side illuminated image sensor 300 may form a greater incident angle with respect to the two-side illuminated image sensor 300 when the light is incident on an outer part of the two-side illuminated image sensor 300 than when the light is incident on the center thereof. For example, each of light incident on each of micro lenses 374 through 378 may form angles $\theta_0$, $\theta_1$, $\theta_2$, $\theta_3$, $\theta_4$ different from each other, and may satisfy a condition such as $\theta_0 < \theta_1 < \theta_2 < \theta_3 < \theta_4$. The two-side illuminated image sensor 300 may have a high light efficiency when the optical sensing layer 330 receives the whole light incident from the front side. If the angle with respect to the two-side illuminated image sensor 300 is too large, some of the incident light may not be received by the optical sensing layer 330, and thus, the light efficiency of the two-side illuminated image sensor 300 may be lowered. An angle of the incident light passing through each of microlenses may be refracted and changed with respect to the optical sensing layer 330. In an arrangement of microlenses that are greatly misaligned with optical sensing cells when the microlenses are away from the center CS of the two-side illuminated image sensor 300, light having passed through the second microlens array 370 may be incident on the second optical sensor layer 330 at an incident angle nearly perpendicular to the second optical sensor layer 330. In this arrangement of microlenses, since the misalignment between the microlenses and the optical sensing cell compensates for an incident angle with respect to the microlens array 370, the optical sensing layer 330 may receive the incident light nearly perpendicular to the optical sensing layer 330 from the front side. Thus, light efficiency of the two-side illuminated image sensor 300 may be enhanced.

FIG. 3B is a conceptual diagram of a two-side illuminated image sensor in which a plurality of optical sensing cells in an optical sensor layer are arranged to be misaligned with a plurality of microlenses in a microlens array. Referring to FIG. 3B, a space Δd1 between a plurality of optical sensing cells is smaller than a space Δd2 between a plurality of microlenses, and a microlens and an optical sensing cell which are located at a center of the two-side illuminated image sensor are arranged to be aligned with each other. In this arrangement, if an optical sensing cell and a microlens corresponding thereto are away from the center of the two-side illuminated image sensor 300, the optical sensor and the microlens may be greatly shifted from each other. In such an arrangement that a microlens is shifted with an optical sensing cell, an angle at which light is incident through the microlens may be adjusted.

Referring to FIG. 3B, circles drawn in a solid line respectively represent microlenses, and squares in drawn in a solid line respectively represent optical sensing cells. Although a microlens is located a same position as a position of an optical sensing cell at the center CS of the two-side illuminated image sensor, a microlens, located away from the center CS, is shifted away from an optical sensing cell corresponding to the microlens. A space Δd2 between microlenses may be smaller than a space Δd1 between optical sensing cells.

In the two-side illuminated image sensor, a microlens array is used to increase a light gathering power. If a microlens array is not included in the two-side illuminated image sensor, the two-side illuminated image sensor may collect only light incident on the two-side illuminated image sensor in a direction perpendicular to the two-side illuminated image sensor. However, if a microlens array is included in the two-side illuminated image sensor, the two-side illuminated image sensor may also collect light incident on the two-side illuminated image sensor at an angle within a certain range from a line perpendicular to the two-side illuminated image sensor, due to a light-collecting effect of a lens. Accordingly, since the two-side illuminated image sensor may receive light incident on the two-side illuminated image sensor at a wide angle, light efficiency may be enhanced. However, for this, since a lens having a large aperture is needed, a volume of the two-side illuminated image sensor may be increased.

Alternately, if a space between microlenses is smaller than a space between optical sensing cells, an optical sensing cell and a microlens may be arranged to be shifted from each other. If an optical sensing cell and a microlens which are located at a center CS of the two-side illuminated image sensor are arranged to be aligned with each other, an optical sensing cell that is away from the center CS and a microlens corresponding thereto may be arranged to be gradually shifted from each other.

Since light is incident in a direction nearly perpendicular to an optical sensing cell that is arranged near the center CS of the two-side illuminated image sensor, the optical sensing cell may have high light efficiency. However, in the case of an optical sensing cell arranged at an outer part of the two-side illuminated image sensor, since light is incident on the optical sensing cell at a greater angle compared to when light is incident on the center CS, light efficiency of the two-side illuminated image sensor may deteriorate.

Accordingly, a space between microlenses may be determined as being smaller than a space between optical sensing cells, by taking into account a rate at which an incident angle is increased according to a distance between an optical sensing cell and the center CS of the two-side illuminated image sensor. Resultantly, since a microlens and a color filter are shifted away from an optical sensing cell at a certain angle and the angle corresponds to an angle at which light is incident, light efficiency at an outer part of the two-side illuminated image sensor may be enhanced.

Figure 4:
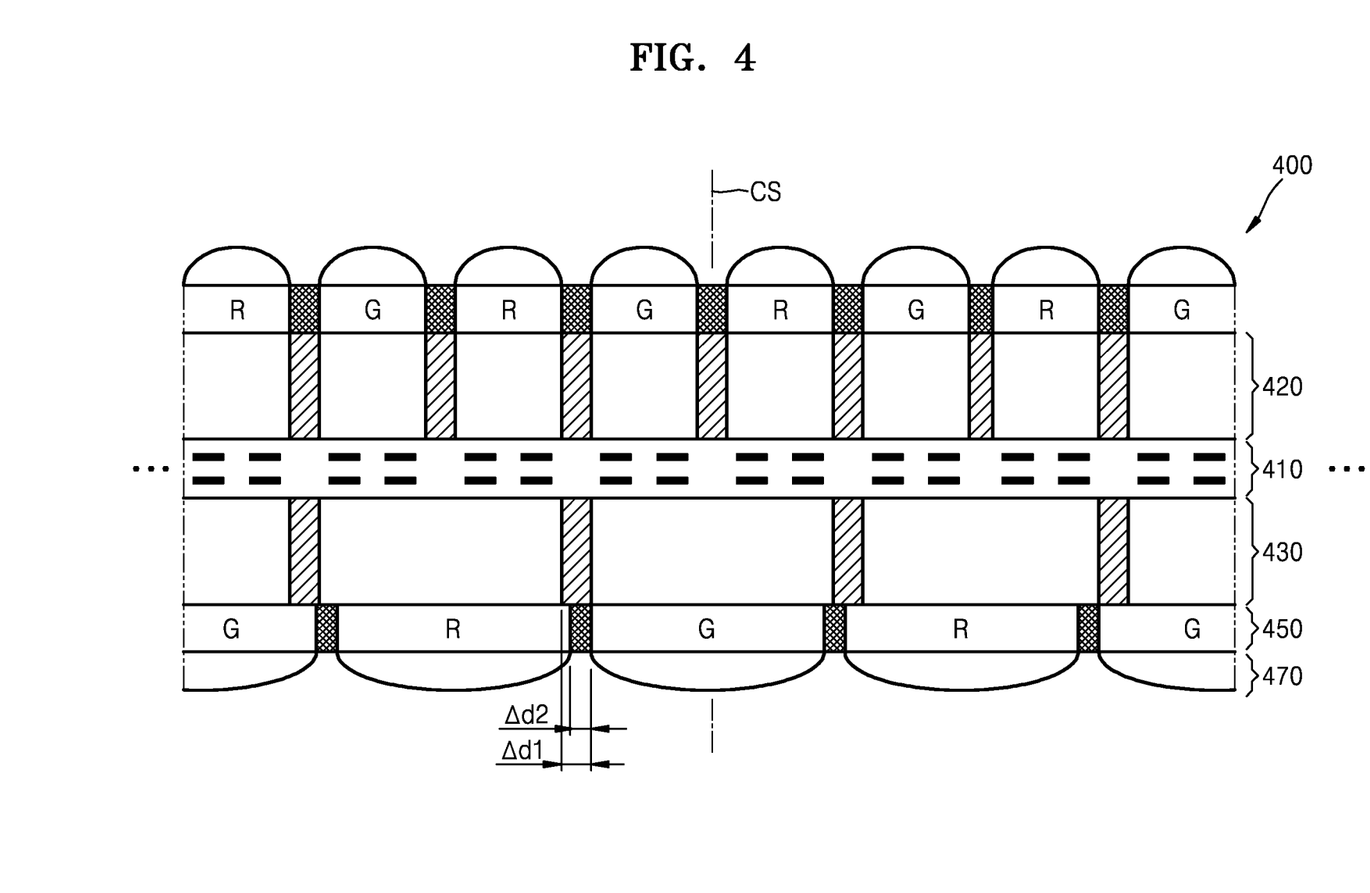
FIG. 4 illustrates a diagram of a two-side illuminated image sensor according to another exemplary embodiment.

FIG. 4 is a cross-sectional view of a two-side illuminated image sensor 400 according to another exemplary embodiment. The two-side illuminated image sensor shown in FIG. 4 has many same features as those of the two-side illuminated image sensor shown in FIG. 3A. Thus, hereinafter, a difference therebetween is described.

Referring to FIG. 4, the two-side illuminated image sensor 400 may include a signal wiring layer 410, a first optical sensor layer 420, a second optical sensor layer 430, a second color filter layer 450, and a second microlens array 470. The second microlens array 470 includes a plurality of microlenses. The plurality of microlenses in the second microlens array 470 and a plurality of optical sensing cells in the second optical sensor layer 430 are arranged to be misaligned with each other. A size of a light-receiving surface of the plurality of optical sensing cells in the first optical sensor layer 420 may be different from a size of a light-receiving surface of an optical sensing cell in the second optical sensor layer 430 may be different from each other. For example, an optical sensing cell in the second optical sensor layer 430 may be arranged to face a plurality of optical sensing cells in the first optical sensor layer 420. For example, an optical sensing cell in the second optical sensor layer 430 may be arranged to face four optical sensing cells arranged in a 2×2 pattern in the first optical sensor layer 420. In such an arrangement, since the signal wiring layer 410 needs to read electrical signals received from both the first optical sensor layer 420 and the second optical sensor layer 430, if optical sensing cells in both optical sensor layers are arranged to face each other, a circuit for reading the electrical signals may be easily configured. If a size of a light-receiving surface of each optical sensing cell is increased, a total number of pixels is decreased, but a sensitivity to light when an image is captured in a dark indoor place may be increased. Accordingly, a two-side illuminated image sensor, appropriate for various photographing situations, may be designed by determining a number of pixels of a front side of the two-side illuminated image sensor as being different from a number of pixels of a rear side thereof, as needed. Additionally, since the two-side illuminated image sensor has such an arrangement that a space Δd1 between optical sensing cells is smaller than a space Δd2 between microlenses, and a microlens and an optical sensing cell which are located at a center CS of the two-side illuminated image sensor 400 are aligned with each other, light efficiency at an outer part of the two-side illuminated image sensor 400 may be enhanced, by taking into account, in advance, a rate at which an incident angle is increased according to a distance between an optical sensing cell and the center CS of the two-side illuminated image sensor.

Figure 5:
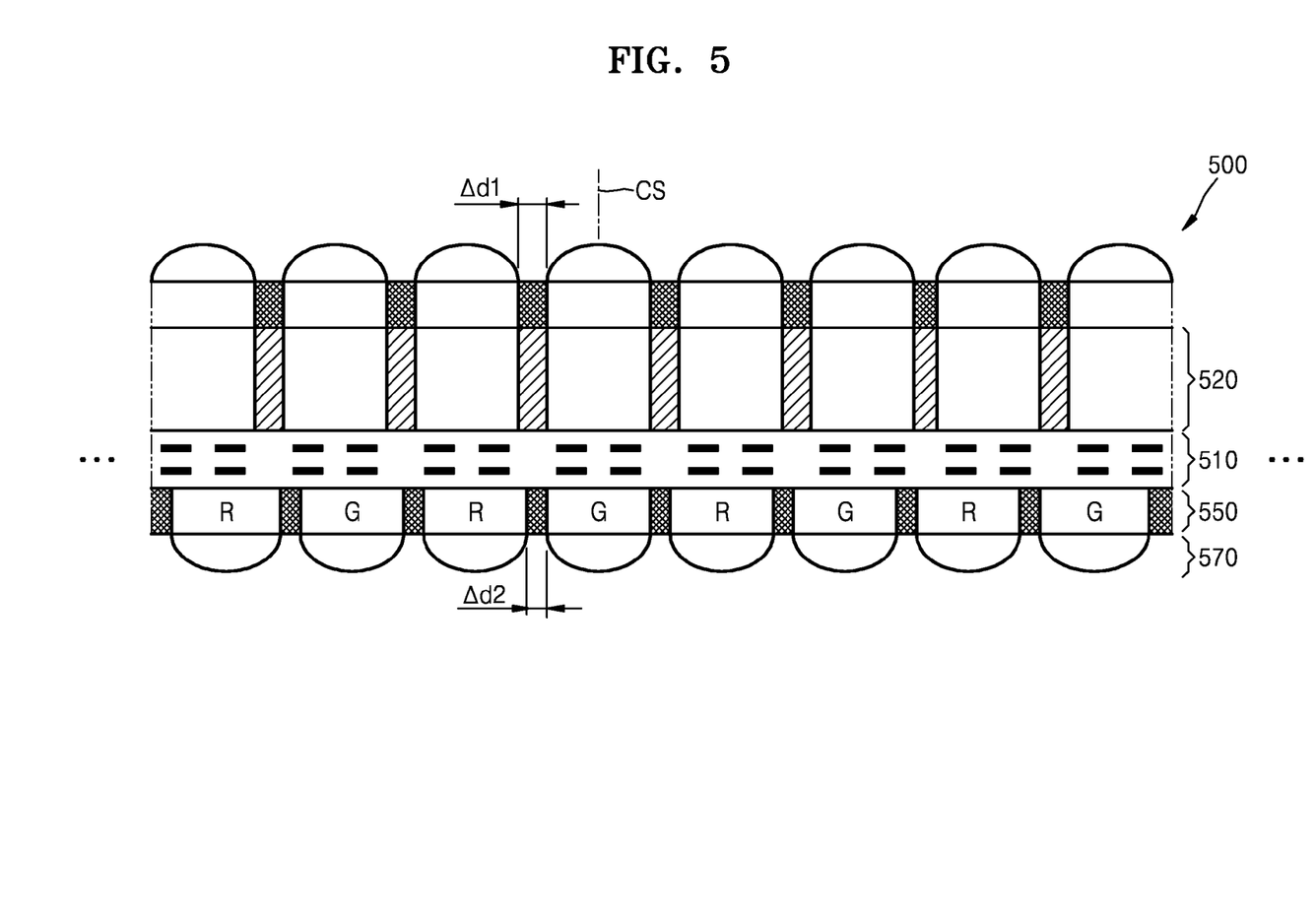
FIG. 5 illustrates a diagram of a two-side illuminated image sensor according to another exemplary embodiment.

FIG. 5 is a cross-sectional view of a two-side illuminated image sensor 500 according to another exemplary embodiment. Unlike the two-side illuminated image sensors shown in FIGS. 1A, 1B, 2A, 2B, 3A, 3B, and 4, the two-side illuminated image sensor 500 may have a structure that includes one optical sensor layer. Referring to FIG. 5, the two-side illuminated image sensor 500 may include an optical sensor layer 520 that includes a plurality of optical sensing cells, a signal wiring layer 510 for reading an electrical signal from the optical sensor layer 520, a first color filter layer 540 located on the optical sensor layer 520, a first microlens array 560 arranged on the first color filter layer 540, a second color filter layer 550 that includes a plurality of color filters facing the plurality of optical sensing cells with the signal wiring layer 510 having therebetween, and a second microlens array 570 that is arranged on the second color filter 550. In the two-side illuminated image sensor 500, a plurality of microlenses in the second micro array 570 and a plurality of optical sensing cells included in the optical sensor layer 520 may be arranged to be misaligned with each other. As described above, in such an arrangement, a light-gathering power at an outer part of the two-side illuminated image sensor 500 may be enhanced.

In the current embodiment, since only one optical sensor layer 520 is arranged in the two-side illuminated image sensor 500, light incident through the second microlens array 570 may not arrive directly at the optical sensor layer 520, and may pass through the signal wiring layer 510. The signal wiring layer 510 may be formed of metal. A part of the light passing through the signal wiring layer 510 may not arrive at the optical sensor layer 520 due to scattering, reflection, or the like, and thus, light efficiency may be reduced. The light may be incident on the two-side illuminated image sensor at an incident angle nearly perpendicular to the signal wiring layer 510, so as to prevent the light from colliding with the signal wiring layer 510, scattering and being reflected. Since an incident angle at which the light is incident on the two-side illuminated image sensor 500 is great at an outer part of the two-side illuminated image sensor 500, a microlens that is located away from a center CS of the two-side illuminated image sensor 500 may be arranged to be misaligned with an optical sensing cell, so that light having passed through the second microlens array 570 is incident on the optical sensing layer 520 at an incident angle nearly perpendicular to the optical sensor layer 520. Thus, scattering and reflection of the light which may be caused by the signal wiring layer 510 may be minimized.

Figure 6:
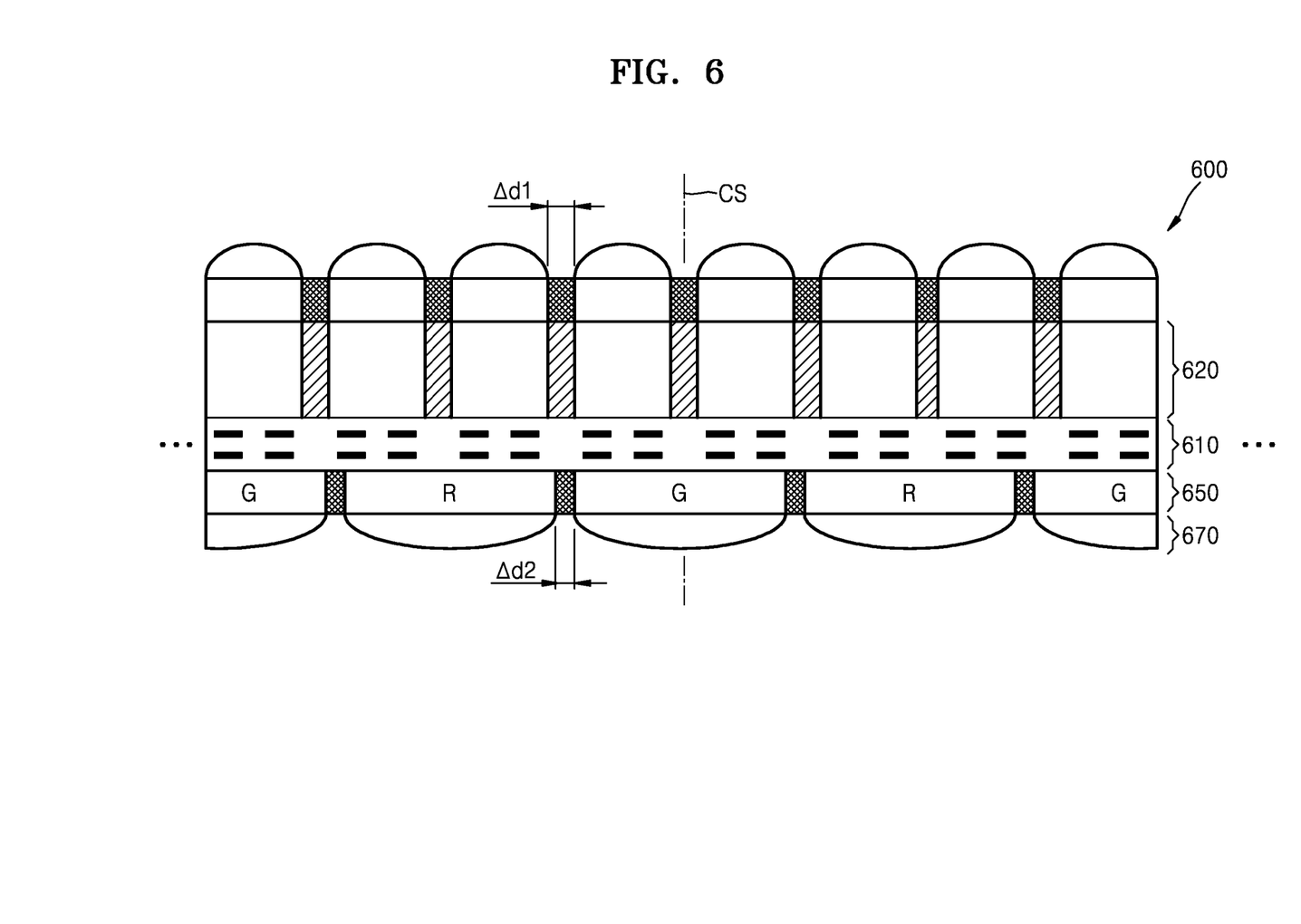
FIG. 6 illustrates a diagram of a two-side illuminated image sensor according to another exemplary embodiment.

FIG. 6 is a cross-sectional view of a two-side illuminated image sensor 600 according to another exemplary embodiment. The two-side illuminated image sensor shown in FIG. 6 has many same features as those of the two-side illuminated image sensor 500 shown in FIG. 5. Thus, hereinafter, a difference therebetween is described.

Referring to FIG. 6, in the current embodiment, the two-side illuminated image sensor 600 may include a second microlens array 670 that includes a plurality of microlenses. The plurality of microlenses in the second microlens array 670 and a plurality of optical sensing cells in a second microlens array 620 are arranged to be misaligned with each other. A size of an optical sensing cell in the optical sensor layer 620 may be different from a size of a color filter in a second color filter layer 650. For example, an optical sensing cell in the optical sensor layer 620 may be arranged to face a plurality of color filters in the second color filter layer 650. For example, a color filter in the second color filter layer 650 may be arranged to face four optical sensing cells arranged in a 2×2 pattern in the optical sensor layer 620. In such an arrangement, a circuit of the signal wiring layer 610 for reading an electrical signal may be easily configured. As a size of a color filter is increased, since a plurality of optical sensing cells corresponding to the color filter reads a color, a total number of pixels may be decreased, but a sensitivity to light may be enhanced. Accordingly, a two-side illuminated image sensor 600 may be designed to be appropriate for various photographing situations, by determining a number of pixels of a front side of the two-side illuminated image sensor 600 as being different from a number of pixels of a rear side thereof, as needed. Additionally, since the two-side illuminated image sensor 600 has such an arrangement that a space Δd1 between optical sensing cells is smaller than a space Δd2 between microlenses, and a microlens and an optical sensing cell which are located at a center CS of the two-side illuminated image sensor 600 are aligned with each other, light efficiency of an optical sensing cell located at an outer part of the two-side illuminated image sensor 600 may be enhanced, by taking into account, in advance, a rate at which an incident angle is increased according to a distance between an optical sensing cell and the center CS of the two-side illuminated image sensor 600.

According to one or more exemplary embodiments, since a two-side illuminated image sensor includes a first optical sensor layer and a second optical sensor layer respectively at front and rear sides of the two-side illuminated image sensor with a signal wiring layer located therebetween, the two-side illuminated image sensor may capture an image by using both the front side and the rear side of the two-side illuminated image sensor. Additionally, light efficiency may be enhanced by arranging a microlens and an optical sensing cell to be misaligned with each other.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A two-side illuminated image sensor comprising:
   a first optical sensor layer comprising a plurality of optical sensing cells configured to sense a light incident from a first side of the image sensor and generate an electrical signal based on the light incident from the first side;
   a second optical sensor layer comprising a plurality of optical sensing cells configured to sense a light incident from a second side of the image sensor and generate an electrical signal based on the light incident from the second side, the second side opposing the first side;
   a signal wiring layer disposed between the first optical sensor layer and the second optical sensor layer, and configured to read the electrical signal obtained from the first optical sensor layer and the electrical signal obtained from the second optical sensor layer;
   a first color filter layer disposed on the first optical sensor layer, and comprising a plurality of color filters respectively facing the plurality of optical sensing cells in the first optical sensor layer;
   a second color filter layer disposed on the second optical sensor layer, and comprising a plurality of color filters respectively facing the plurality of optical sensing cells in the second optical sensor layer; and
   a second microlens array disposed on the second color filter layer and comprising a plurality of microlenses, wherein the plurality of microlenses in the second microlens array and the plurality of color filters in the second color filter layer are arranged to be misaligned with the plurality of optical sensing cells in the second optical sensor layer.

2. The two-side illuminated image sensor of claim 1, further comprising a first microlens array disposed on the first color filter layer and comprising a plurality of microlenses.

3. The two-side illuminated image sensor of claim 1, wherein a size of a light-receiving surface of the plurality of optical sensing cells in the first optical sensor layer is equal to a size of a light-receiving surface of the plurality of optical sensing cells in the second optical sensor layer.

4. The two-side illuminated image sensor of claim 3, wherein the plurality of optical sensing cells in the first optical sensor layer and the plurality of optical sensing cells in the second optical sensor layer are arranged to face each other in a one-to-one correspondence with each other.

5. The two-side illuminated image sensor of claim 1, wherein a size of a light-receiving surface of each of the plurality of optical sensing cells in the first optical sensor layer is different from a size of a light-receiving surface of each of the plurality of optical sensing cells in the second optical sensor layer.

6. The two-side illuminated image sensor of claim 5, wherein an optical sensing cell in the second optical sensor layer is arranged to face a plurality of optical sensing cells in the first optical sensor layer.

7. The two-side illuminated image sensor of claim 6, wherein four optical sensing cells of the plurality of optical sensing cells in the first optical sensor layer are arranged in a two-by-two form, and are arranged to face the optical sensing cell in the second optical sensor layer.

8. The two-side illuminated image sensor of claim 1, wherein a space between the plurality of microlenses in the second microlens array is smaller than a space between the plurality of optical sensing cells in the second optical sensor layer.

9. The two-side illuminated image sensor of claim 1, wherein the first side is a front side of the two-side illuminated image sensor, and the second side is a rear side of the two-side illuminated image sensor.

10. A two-side illuminated image sensor comprising:
   an optical sensor layer comprising a plurality of optical sensing cells configured to sense a light and generate an electrical signal based on the incident light;
   a signal wiring layer configured to read the electrical signal obtained from the optical sensor layer;
   a first color filter layer disposed on the optical sensor layer, and comprising a plurality of first color filters respectively facing the plurality of optical sensing cells;
   a second color filter layer comprising a plurality of second color filters respectively facing the plurality of optical sensing cells across a signal wiring layer that is disposed between the first color filter layer and the second color filter layer; and
   a second microlens array disposed on the second color filter layer, and comprising a plurality of microlenses arranged to face the plurality of second color filters,
   wherein a plurality of microlenses in the second microlens array and the plurality of optical sensing cells in the optical sensor layer are arranged to be misaligned with each other in a horizontal direction,
   wherein a space between the plurality of microlenses in the second microlens array is smaller than a space between the plurality of optical sensing cells in the optical sensor layer.

11. The two-side illuminated image sensor of claim 10, wherein a color filter in the second color filter layer is arranged to face the plurality of optical sensing cells in the optical sensor layer.

12. The two-side illuminated image sensor of claim 10, wherein four optical sensing cells of the plurality of optical sensing cells in the first optical sensor layer are arranged in a two-by-two form, and a color filter in the second color filter layer is arranged to face the four optical sensing cells.

13. The two-side illuminated image sensor of claim 10, further comprising a first microlens array disposed on the first color filter layer and comprising a plurality of microlenses.

* * * * *